United States Patent [19]
Shishiguchi

[11] Patent Number: 6,010,914
[45] Date of Patent: Jan. 4, 2000

[54] METHOD FOR MANUFACTURING A SEMICONDUCTOR DEVICE

[75] Inventor: Seiichi Shishiguchi, Tokyo, Japan

[73] Assignee: NEC Corporation, Tokyo, Japan

[21] Appl. No.: 08/958,666

[22] Filed: Oct. 28, 1997

[30] Foreign Application Priority Data

Oct. 28, 1996 [JP] Japan ................................. 8-284904

[51] Int. Cl.[7] .......................... G01R 31/26; H01L 21/66
[52] U.S. Cl. ................................. 438/14; 438/16; 438/18
[58] Field of Search ................................. 438/14, 16, 18

[56] References Cited

U.S. PATENT DOCUMENTS

| | | |
|---|---|---|
| 5,477,325 | 12/1995 | Miyashita et al. . |
| 5,563,448 | 10/1996 | Lee et al. . |
| 5,611,855 | 3/1997 | Wijaranakula . |
| 5,863,807 | 1/1999 | Jang et al. ................................. 438/14 |

FOREIGN PATENT DOCUMENTS

| | | |
|---|---|---|
| 2-105438 | 4/1990 | Japan . |
| 2-206146 | 8/1990 | Japan . |
| 6-349925 | 12/1994 | Japan . |

OTHER PUBLICATIONS

"Semiconductor Crystal Material General Handbook", issued by K. K. Fuji Techno–system, pp. 574–575, Jun. 20, 1986.

*Primary Examiner*—Kevin M. Picardat
*Assistant Examiner*—D. M. Collins
*Attorney, Agent, or Firm*—Foley & Lardner

[57] ABSTRACT

A method for manufacturing a semiconductor device comprises the steps of forming consecutively a silicon oxide layer and a test epitaxial layer in a test pattern area on a silicon wafer, forming an epitaxial layer in a product area for semiconductor devices and on the test epitaxial layer simultaneously, measuring a total thickness of the epitaxial layer and the test epitaxial layer formed in the test pattern area by infrared interference, and determining the thickness of the epitaxial layer formed in the product area based on the total thickness to control the thickness of the epitaxial layer in the product area. A thickness control for a very thin epitaxial layer can be obtained.

10 Claims, 8 Drawing Sheets

4,010,914

METHOD FOR MANUFACTURING A SEMICONDUCTOR DEVICE

BACKGROUND OF THE INVENTION (a) Field of the Invention

The present invention relates to a method for manufacturing a semiconductor device and, more particularly, to an improvement of process control for manufacturing a semiconductor device.

(b) Description of the Related Art

Si-epitaxial layer (or hereafter, simply referred to as epitaxial layer,) is widely used as a collector region for a bipolar LSI family. Conventionally, an infrared interference is used for the measurement of the thickness of the epitaxial layer.

The infrared interference uses the property that the refractive index of Si changes considerably when exposed to infrared radiation depending on the level of impurity density in a Si substrate. FIG. 1 shows an example of a conventional measurement in a sample wherein an epitaxial layer of a non-doped or lightly doped layer is grown after doping of antimony in Si substrate in a density of more than $1 \times 10^{18}/cm^3$. The thickness is measured by an interference between a reflection from the epitaxial surface 18 and a reflection from the interface between the epitaxial layer 18 and the Si wafer 11 (or epitaxial/wafer interface).

The measurement of thickness by the infrared interference method enables measuring a wide range of thickness of Si epitaxial layer covering from about a few-$\mu$m to some-10 $\mu$m without destroying the Si epitaxial layer. It is widely known as an "Epitaxial Layer Thickness Control Method", as described in, for example, "Semiconductor Crystal Material General Handbook" issued by K.K. Fuji Techno-system Page 574–575 issued Jun., 20, 1986

The infrared interference method for measuring the thickness of an epitaxial layer has a deficiency that the method cannot measure an ultra thin layer having a thickness less than 0.5 $\mu$m. This is because the interference of reflected waves does not occur when the wavelength of the infrared ray is longer than the epitaxial layer thickness. In this respect, the measurement of an oxide film formed on the Si surface in thickness less than 0.1 $\mu$m can be measured by using the interference of visible light which has a shorter wavelength than that of infrared ray. However, in the case of a Si epitaxial layer, the difference of refractive index within visible light is very little and the reflections do not cause any measurable interference.

In view of the recent trend for higher integration and performance of the LSI, a thinner epitaxial layer is desired which necessitates controlling the epitaxial layer thickness on the order of less than 0.5 $\mu$m. For example, in the development of a next generation MOS transistor having a gate width of 0.1 $\mu$m, the use of the epitaxial layer for the source/drain regions and a channel region is proposed. The thickness of the epitaxial layer will be less than 0.1 $\mu$m in this case.

Another method using a destructive measurement is known, as described in Patent Publication No.JP-A-2(1990)-105438. In this method, a SiO$_2$ film 29 is patterned to have openings of a few square millimeter on the silicon wafer 21 as shown in FIG. 2A, then an epitaxial layer 28 is selectively grown in the openings, as shown in FIG. 2B. Thereafter, the wafer is dipped in a dilute HF (hydrofluoric) solution for removing the SiO$_2$ oxide pattern 29 shown in FIG. 2C. The distance between the Si surface 21 and the Si epitaxial layer can be measured by using a bandgap meter to obtain the thickness of the Si epitaxial layer.

The destructive method has also a problem, in that it is applicable only in the special occasion wherein the openings provided for exposing the Si surface in an oxide layer is filled with an epitaxial layer selectively grown in the openings. Moreover, since it takes expertise and a longer time for measurement, a test wafer is needed in addition to the regular products, which increases total manufacturing cost. As a result, a new measurement is desired for measuring an ultra-thin Si epitaxial layer without the use of the infrared interference widely used currently.

SUMMARY OF INVENTION

It is therefore an object of the present invention to provide a method for manufacturing a semiconductor, which is capable of improvement of product yield and reliability, by providing a new method for measuring the thickness of a thin epitaxial layer.

According to the present invention, a thin epitaxial layer having a thickness less than 0.5 $\mu$m can be measured by measuring the thickness of the test pattern in a non-destructive method which was not been realized in conventional techniques. The thickness control of a thin epitaxial layer by using the present invention can improve the product yield and reliability of semiconductor devices.

The above and other objects, features and advantages of the present invention will be more apparent from the following description, referring to the accompanying drawings.

PREFERRED EMBODIMENTS OF THE INVENTION

Now, the present invention is more specifically described with reference to the accompanying drawings.

Figure 1:
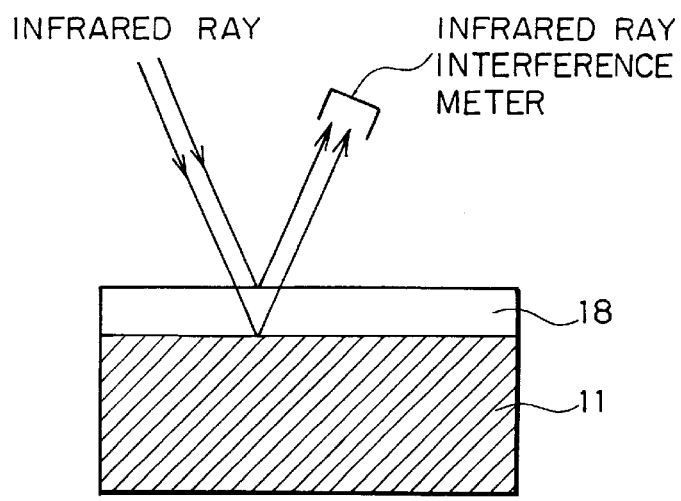
FIG. 1 is a schematic cross-sectional view for showing a conventional thickness measurement using an infrared interference meter.
Figure 2A:
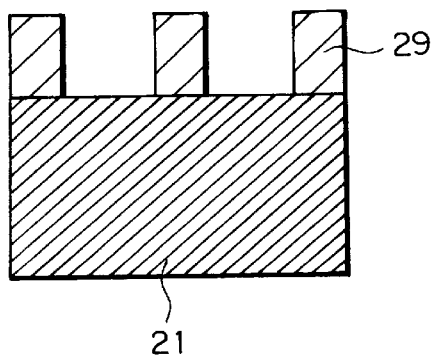
FIGS. 2A, 2B and 2C are cross-sectional views of a semiconductor device in consecutive steps of fabrication thereof, for showing a second conventional thickness measurement.
Figure 2B:
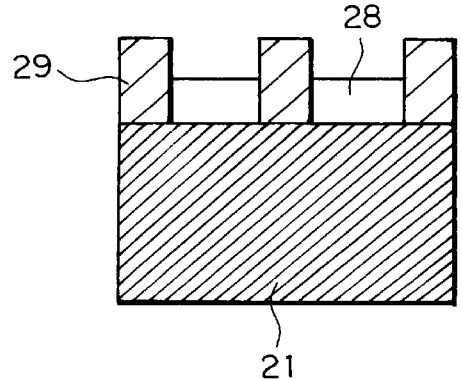
Figure 2C:
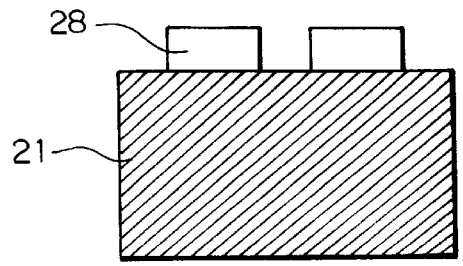
Figure 3A:
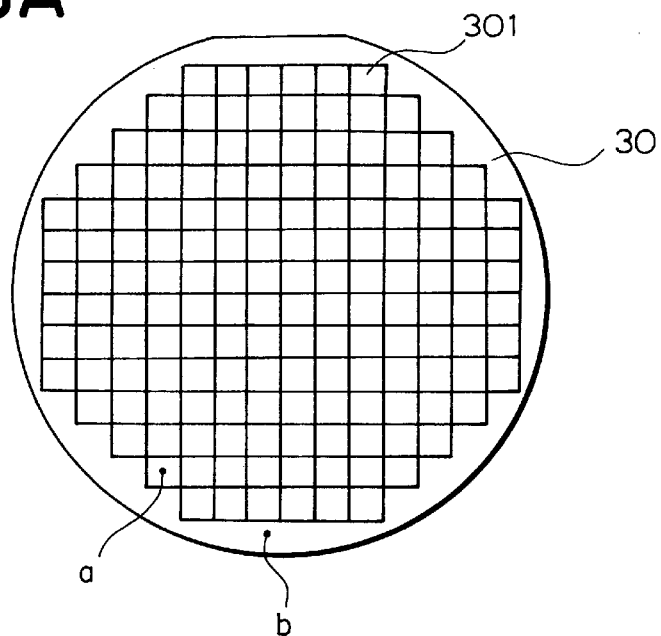
FIG. 3A is a top plan view of a semiconductor wafer for showing a method according to a first embodiment of the present invention.

Referring to FIG. 3A, the first embodiment of the present invention is described by way of a control method of a Si epitaxial layer or a $Si_{1-x}Ge_x$ epitaxial layer selectively grown on source/drain regions for a MOS transistor.

In FIG. 3A, a wafer 30 is divided into a plurality of chips 30 arranged in a matrix. A test pattern area "b" for measurement is additionally provided in the vicinity of an edge of the wafer for monitoring a product area "a" in each of the chips 301. The test pattern area "b" is selected, for example, at a location where the number of chips per a wafer is not reduced by allocating the test pattern area, and it is preferred that its size be made as small as possible. If the central area of the wafer is to be monitored, however, a central chip can be assigned for the test pattern area "b". Also, a plurality of the test pattern areas "b" may be provided in a single wafer.

Figure 3B:
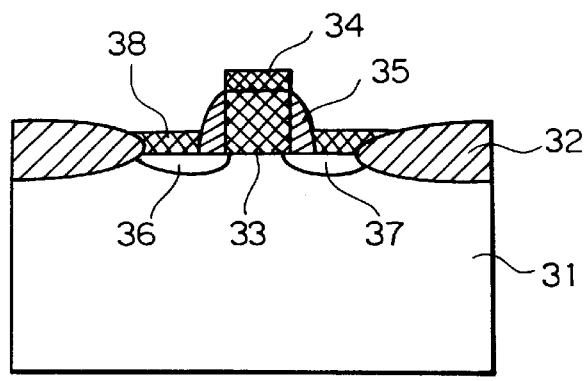
FIG. 3B is a cross-sectional view taken along at the product area "a" of FIG. 3A.

In FIG. 3B showing the product area "a" of the wafer, a field oxide film 32 is first formed on the silicon substrate 31, then a gate oxide film 33, a gate poly-Si film 34 and a gate sidewall oxide film 35, are consecutively formed. Subsequently, a source region 36 and a drain region 37 are formed on the silicon wafer 31. The location of the product area "a" in FIG. 3A is only an example and it does not indicate a particular chip on the wafer.

Figure 3C:
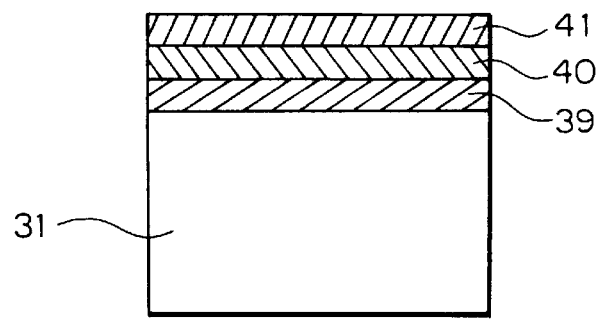
FIG. 3C is a cross-sectional view taken at the test pattern area "b" of FIG. 3A.

In the test pattern area "b", as shown in FIG. 3C, after a first layer 39 having an optical refractive index different from that of Si within a visible light range is formed on the silicon substrate 31, a second layer 40 made of Si or a compound $Si_{1-x}Ge_x$ is formed on the first layer 39. As the material for the first layer 39 having a different refractive index from Si, a Si-oxide layer or a Si-nitride layer is preferred because these layers have known optical constants, and can be easily grown on the silicon wafer to ease the measurement.

The thickness of the second layer 40 made of Si or $Si_{1-x}Ge_x$ can be measured by using an optical interference within a visible light range because the refractive index within a visible light range between the Si wafer 31 and the second layer 40 is different. By using a visible light having a wavelength shorter than the infrared ray, accurate control of a thickness can be achieved, which is to be used in the future LSI production ranging from several nanometers to several-hundred nanometers.

In FIG. 3B, an epitaxial layer 38 is grown within each chip at the product area "a". A test pattern layer 41 for measurement is also grown as shown in FIG. 3C at the test pattern area "b" by the same step as the epitaxial layer 38. A sum of the thicknesses of the test pattern layer 41 and the second layer 40 (referred to as total thickness, hereafter) can be measured by the optical interference method. By measuring the total thickness, the thickness of the test pattern layer 41 can be obtained after subtracting the thickness of the second layer 40 from the total thickness. The thickness of the epitaxial layer 38 within the product area can be translated from the thickness of the test pattern layer 41. The translation factor differs depending on the condition of the epitaxial growth, and can be experimentally deducted in advance by using the conventional destructive test.

The second embodiment of the present invention is directed to controlling the thickness of a Si epitaxial layer, or $Si_{1-x}Ge_x$ epitaxial layer selectively grown on the source/drain regions of a MOS transistor similarly to the first embodiment.

Figure 4A:
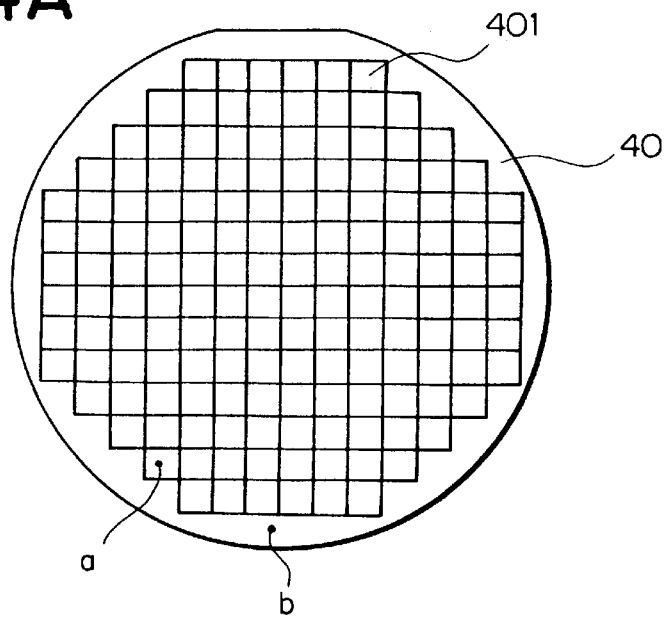
FIG. 4A is a top plan view of a semiconductor wafer according to a second embodiment of the present invention.
Figure 4B:
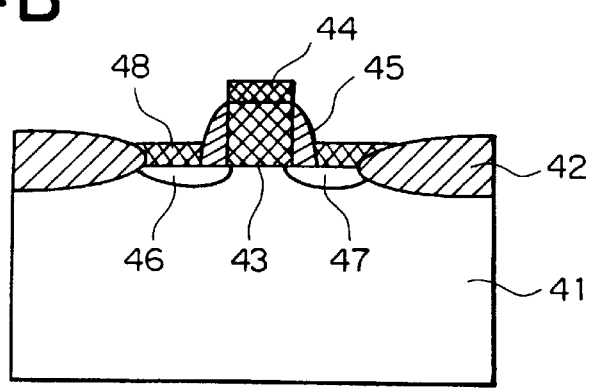
FIG. 4B is a cross-sectional view taken at the product area "a" of FIG. 4A.
Figure 4C:
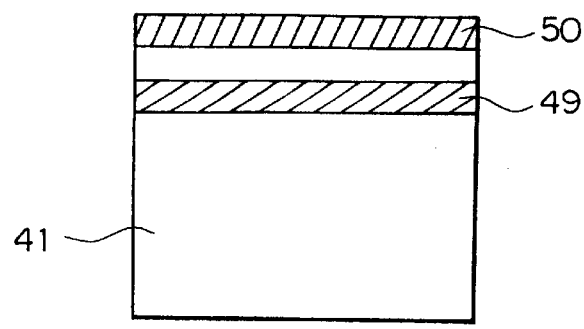
FIG. 4C is a cross-sectional view taken at the test pattern area "b" of FIG. 4A.

FIGS. 4A, 4B and 4C show the second embodiment similarly to FIGS. 3A, 3B and 3C, respectively. In FIG. 4C, an oxide layer, herein called a "buried oxide layer 49" is formed at the test pattern area "b" located in the vicinity of the edge of the wafer 40.

In FIG. 4B, the MOS transistor is formed similarly to the first embodiment. Specifically, a field oxide film 42, a gate oxide film 43, a gate poly-Si film 44 and a gate sidewall oxide film 45 are formed on the silicon substrate 41. Then, an epitaxial layer 50 is grown on the chip area 401 as well as the test pattern area "b" for measurement.

In the second embodiment, since the buried oxide layer 49 formed at the test pattern area "b" has a diffractive index different from that of the silicon substrate 41 within the visible light range, the thickness of the Si crystal layer 50 above the buried layer 49 can be measured by the optical interference. By comparing the thickness above the buried layer 49 before and after the epitaxial growth, the thickness of the Si epitaxial layer 48 can be measured.

In the first and the second embodiments of the present invention, the measurement is directed to the thickness of a Si or $Si_{1-x}Ge_x$ epitaxial layer formed on the source/drain regions of a MOS transistor. However, the measurement of the present invention is not limited to the epitaxial layer on the source/drain regions, but applicable to a channel of a MOS transistor or a base of a bipolar transistor in a thin Si layer having a thickness of less than 0.5 μm. The present invention can be directed to measurement of a thickness of an epitaxial $Si_{1-x}Ge_x$ layer.

Figure 5:
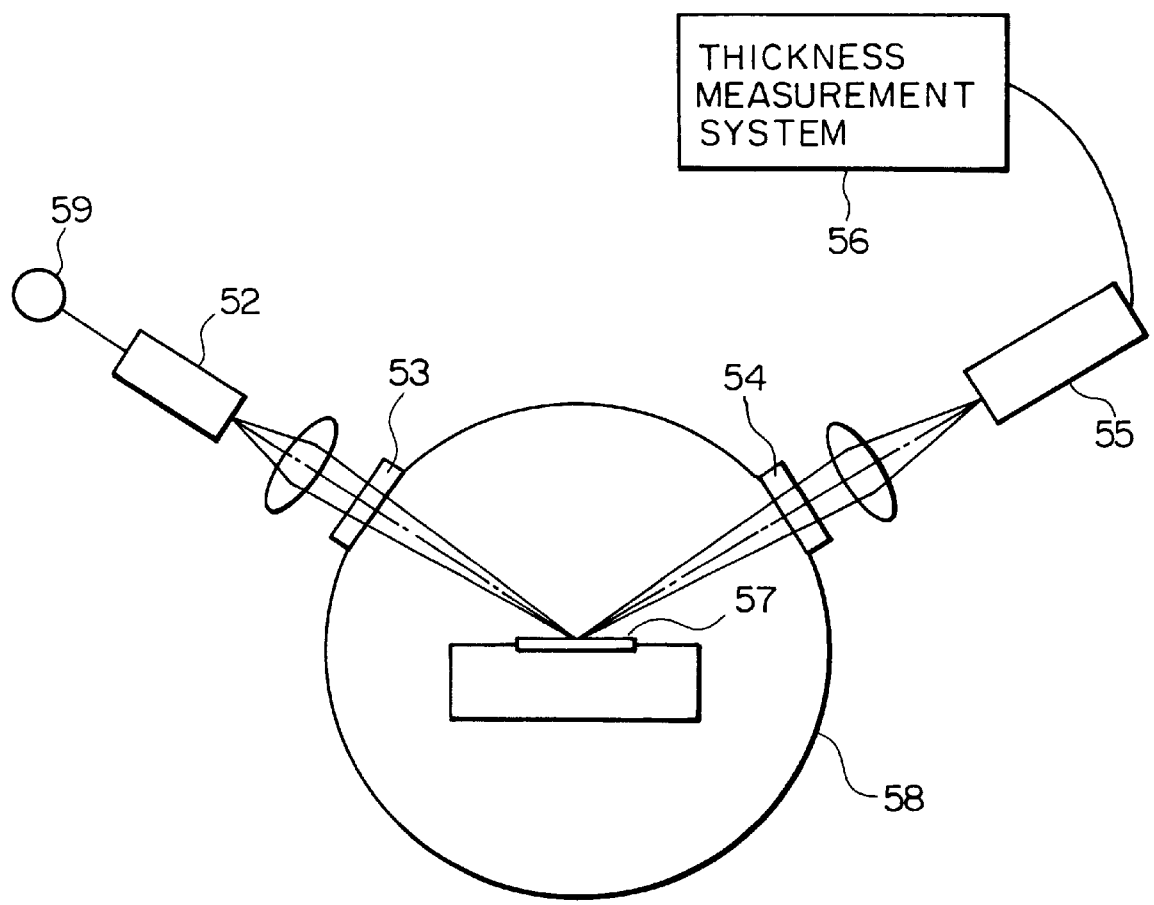
FIG. 5 is a schematic side view of a deposition system according to a third embodiment of the present invention.

Referring to FIG. 5 showing a basic configuration of an epitaxial growth system or deposition system according to a third embodiment of the present invention, the epitaxial growth system comprises a growth chamber 58 and a thickness measurement equipment 56 using an optical interference or ellipsometry. Inside the growth chamber 58, a wafer 57 is disposed on a stage having a heater below the wafer. The thickness measurement equipment 56 or thickness measurement circuit is provided outside the growth chamber 58 which is provided with an inlet a light window 53 and an outlet light window 54 on the wall of the growth chamber 58. A light source 59, an optical splitter 52, and a photosensor 55 are also provided outside the chamber 58 as the other constituents of the thickness measurement system.

By using the growth system as shown in FIG. 5, the thickness measurement in the first and the second embodiments of the present invention are performed. The growth of the epitaxial layer can be measured real-time while the epitaxial process is continued until it is grown to a specified thickness, thereby achieving an accurate thickness of the epitaxial layer with an excellent reproducibility.

SPECIFIC EXAMPLES

First Example

Figure 6A:
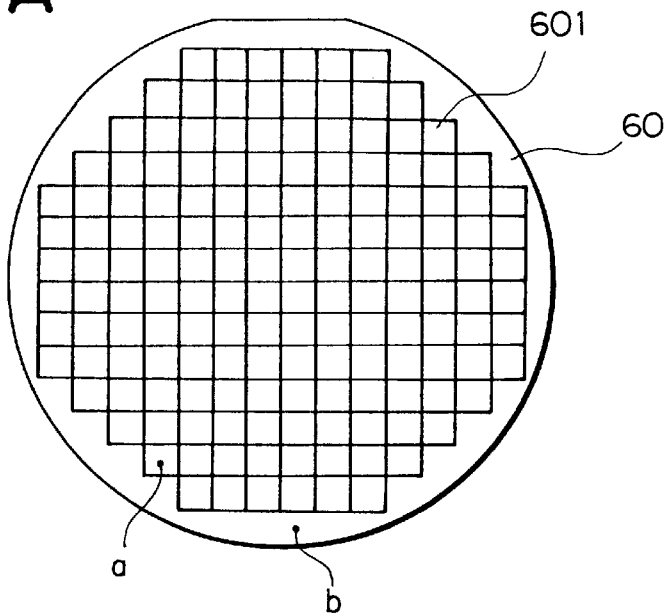
FIG. 6A is a top plan view of a semiconductor wafer of a first specific example according to the first embodiment.
Figure 6B:
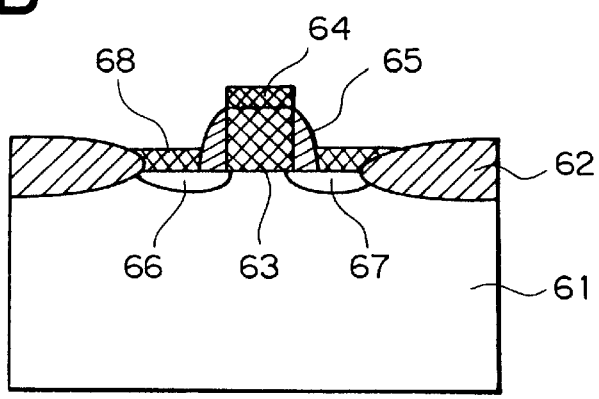
FIG. 6B is a cross sectional view taken along at the product area "a" of FIG. 6A.
Figure 6C:
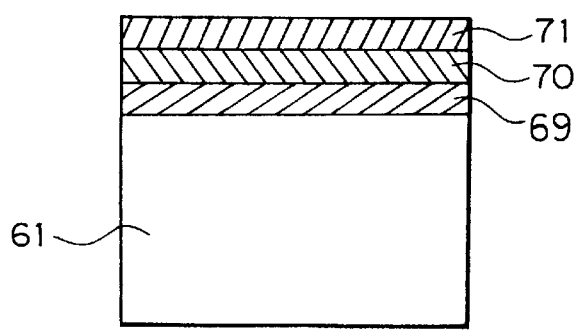
FIG. 6C is a cross-sectional view taken at the test pattern area "b" of FIG. 6A.

First example shown in FIGS. 6A, 6B and 6C is a specific example of the first embodiment of the present invention.

After a field oxide layer 62 is formed on a silicon substrate 61 by a LOCOS technology, a 8 nm-thick gate oxide film 63 is formed by a thermal oxidation method, and a 200 nm-thick gate poly-Si film 64 is grown by a chemical vapor deposition. Then, the gate oxide film 63 and the gate poly-Si film 64 are patterned by a photolithographic technique. Thereafter, 150 nm-thick Si oxide film is grown by a chemical vapor deposition. By using a dry-etching technology, the Si oxide film is removed until the silicon wafer is exposed to be used later as a source 66 and a drain 67, followed by formation of a gate sidewall film 65.

In FIG. 6C, when the field oxide film 62 and the gate oxide film 63 are formed, simultaneously, a Si oxide layer 69 is formed on the test pattern area "b" provided in the vicinity of a wafer edge 60 as a first layer. A poly-Si layer 70 having a thickness of 200 nm is then formed as a second layer when a gate poly-Si layer 64 is formed. Then, a Si epitaxial layer 68 is grown in each chip 601, after the source 66 and the drain 67 are formed using a conventional technique.

The Si epitaxial layer 68 is grown in a high vacuum growth chamber at a pressure less than $1\times10^{-10}$ Torr after a native oxide surface formed on the Si substrate 61 is removed by a dilute HF solution and rinsed with a pure water. The epitaxial growth is conducted at a suitable temperature of 650° C. and $Si_2H_6$ (reactive gas) flow rate of 20 sccm. When the Si epitaxial layer 68 grows within the product area shown in FIG. 6B, a test pattern 71 is also formed on the poly-Si layer 70 in the test pattern area "b", as shown in FIG. 6C.

Under the conditions of the First Example, the growth rate of the Si epitaxial layer 68 equals to the growth rate of the poly-Si layer 71. As a result, the thickness of the Si epitaxial layer 68 can be easily determined by measuring the thickness of the poly-Si layer 70 or the total thickness of the poly-Si layer 70 and the test pattern layer 71. For the measurement of the poly-Si layer 70, a commercially available equipment for light interference measurement equipment can be used.

Second Example

Second example is also a specific example of the first embodiment wherein the thickness of a $Si_{1-x}Ge_x$ epitaxial layer is measured.

The layer structure of the Second Example is grown similarly to the First Example. The $Si_{1-x}Ge_x$ epitaxial layer 68 is grown in a high vacuum growth chamber at a pressure less than $1\times10^{-10}$ Torr after a native oxide surface formed on the Si substrate 61 is removed by a dilute HF solution and rinsed with a pure water. The epitaxial growth is conducted at a substrate temperature of 650° C., $Si_2H_6$ flow rate of 10 sccm and $GeH_4$ flow rate of 5 sccm. Under those conditions, a 10% of Ge concentration is achieved within the $Si_{1-x}Ge_x$ epitaxial layer.

When the $Si_{1-x}Ge_x$ epitaxial layer is grown in the product area "a", a poly-$Si_{1-x}Ge_x$ layer is also grown on the test pattern area "b" on the poly-Si layer simultaneously. Under the conditions of the Second Example, the growth rates of both the $Si_{1-x}Ge_x$ epitaxial layer and the poly-$Si_{1-x}Ge_x$ are equal, which allows measurement of the thickness of the $Si_{1-x}Ge_x$ by measuring the thickness of the poly-$Si_{1-x}Ge_x$ layer thickness on the test pattern. By using a commercially available ellipsometer or an optical interference meter, the total thickness of the three layers consisting of poly-$Si_{1-x}Ge_x$/poly-Si/Si-oxide layers can be measured for determining the thickness of the poly-$Si_{1-x}Ge_x$ epitaxial layer.

Third Example

Figure 7A:
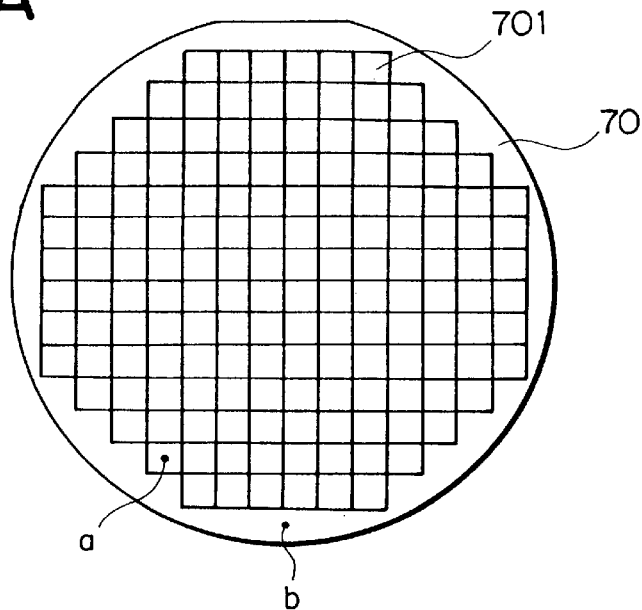
FIG. 7A is a top plan view of a semiconductor wafer of a third specific example according to the second embodiment.
Figure 7B:
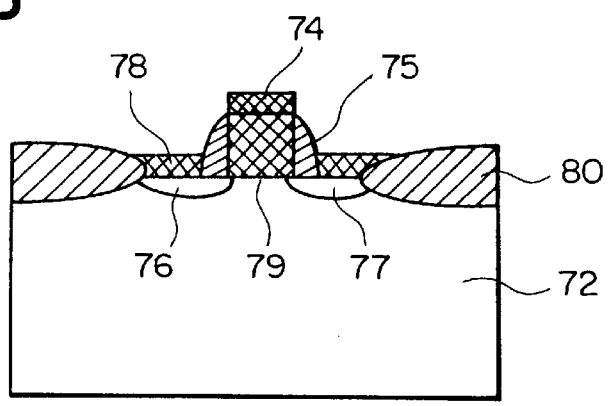
FIG. 7B is a cross sectional view taken at the product area "a" of FIG. 7A.
Figure 7C:
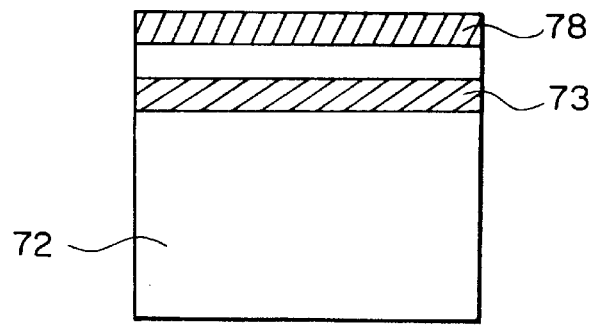
FIG. 7C is a cross-sectional view taken at the test pattern area "b" of FIG. 7A.
Figure 8A:
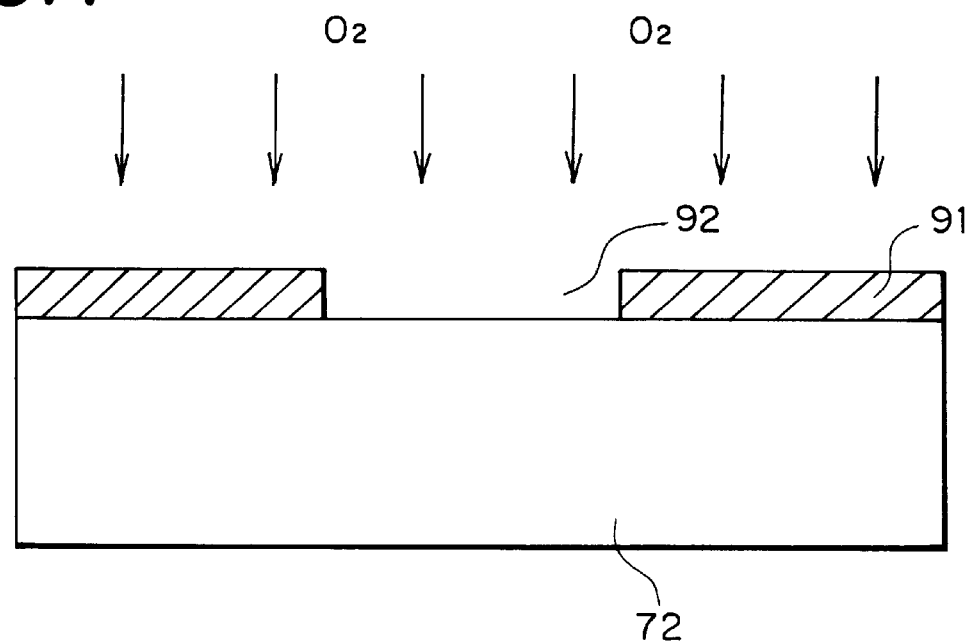
FIGS. 8A and 8B are cross-sectional views of Si wafer in consecutive steps in the fabrication process of the semiconductor device of FIGS. 7A, 7B and 7C; and, FIG. 9 is a schematic side view of a specific example of a deposition system for the semiconductor device according to the third embodiment of the present invention.

Third Example is a specific example of the second embodiment which is shown in FIGS. 7A, 7B and 7C. Third example is manufactured by the steps shown in FIGS. 8A and 8B. In FIG. 8A, 200 nm-thick, Si oxide film 91 is deposited on a Si substrate 72 by using a chemical vapor deposition system, then, patterned to have a 1 square millimeter opening 92 by using a photolithography on the test pattern area "b" for exposing the Si surface 92. Then, oxygen ions are introduced to the exposed Si surface 92 with an acceleration energy of 120 keV and at a dosage of $4\times10^{17}/cm^2$ by using a Si oxide layer 82 as a mask. After the resultant wafer is heat treated under 1100° C. for 6 hours, the Si oxide film 91 used for the mask is removed by a dilute HF solution. As shown in FIG. 7B, the buried oxide layer 73 is formed 200 nm below the substrate surface.

Figure 8B:
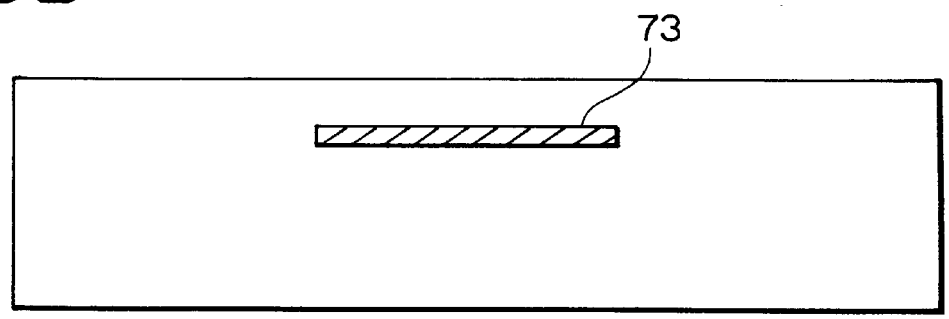

Then, the field oxide film 80, the gate poly-Si 74, the source 76 and the drain 77 are formed within the product area by using a process similar to those in the First and Second Examples, as shown in FIG. 8B. Then, Si or $Si_{1-x}Ge_x$ epitaxial layer 78 is grown on the source 76 and the drain 77 in the product area "a" on the chip area 701, as well as on the test pattern area "b". Conditions for the growth are similar to that of the First Example.

In the case of growing Si epitaxial layer, the film thickness is measured by a difference between the thicknesses before and after the epitaxial growth above the buried layer 73. On the other hand, in the case of growing $Si_{1-x}Ge_x$ epitaxial layer, a commercially available ellipsometer, or an optical interference meter is used for measuring the thickness of the epitaxial layer. The thickness is determined after calculation by assuming the thickness of the three layers, $Si_{1-x}Ge_x$ layer/Si layer/Si oxide film.

Fourth Example

Figure 9:
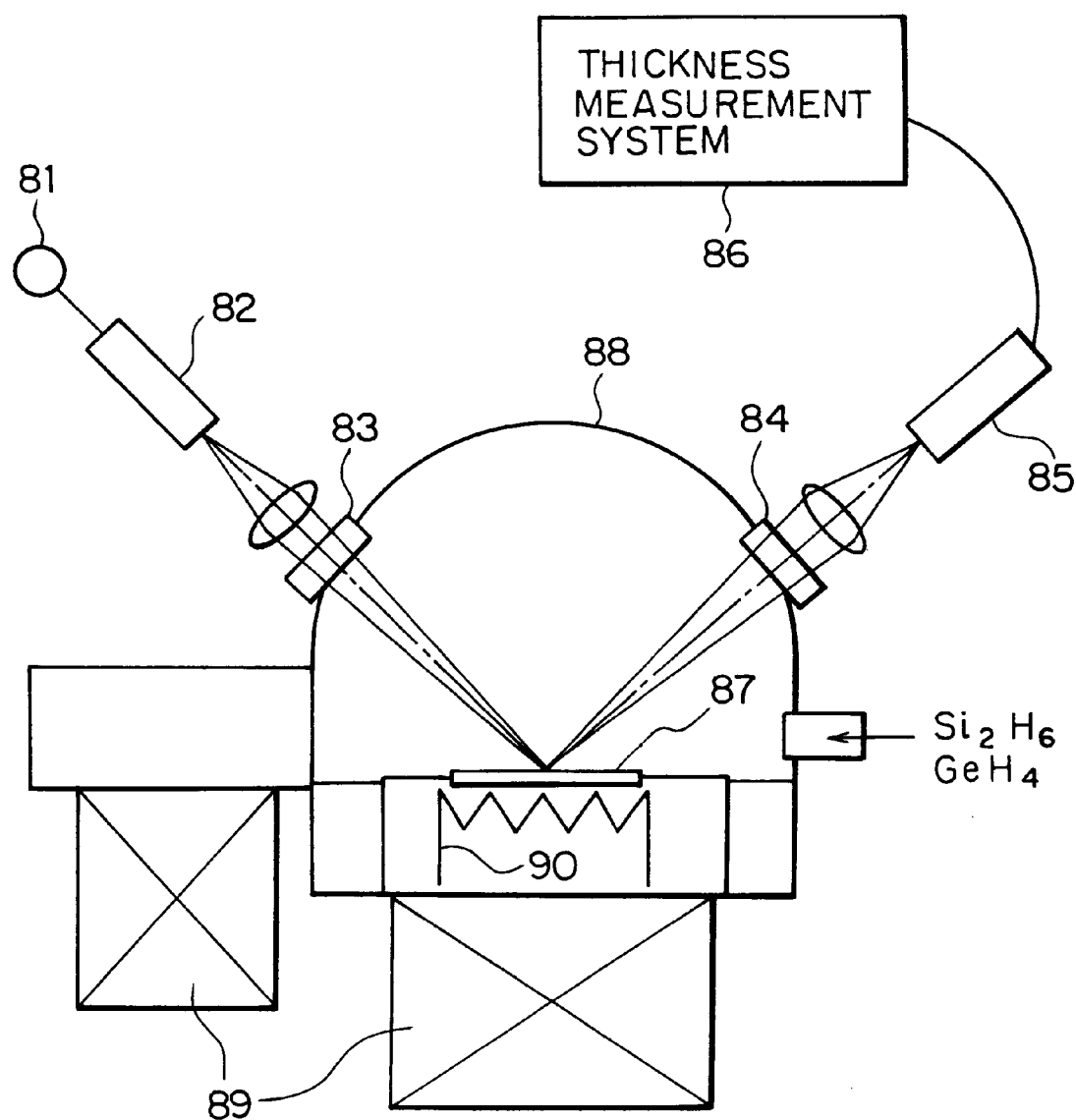

Fourth Example is a specific example of the third embodiment of the present invention. FIG. 9 shows an example of a deposition system for the Fourth Example.

The deposition system comprises a deposition chamber made of stainless steel 88 and a growth thickness measurement system 86 (thickness measurement circuit). A wafer 87 is disposed in the growth chamber 88, wherein a carbon resisting heater 90 is installed under the wafer 87.

Air in the growth chamber 88 is taken out by using vacuum pump 89 through an air outlet disposed below the heater 90 at a side of the growth chamber 88 to obtain a vacuum level of less than a $1\times10^{-10}$ Torr. Reactive gases are fed from the other side of the growth chamber 88. The thickness measurement system 86 is located outside the growth chamber 88. A light inlet window 83 and a light outlet window 84 are provided on the wall of the growth chamber 88 for a light path. A light source 81, a light splitter 82 and a light receiver 85 are also provided for the growth chamber 88.

By actually using the deposition system of FIG. 9, the following results of observations are obtained during the growth of an epitaxial layer. A 200 nm-thick poly-Si pattern for measurement, the gate, and the source/drain regions of the MOS transistor were formed using a process similar to that of First Example.

After a native oxide film was removed by a dilute HF solution, pure water rinse and a centrifugal drying, the wafer 87 was carried to the growth chamber 88. The wafer was then heated up to 650° C. under the condition of 20 sccm of reactive gas ($Si_2H_6$), thereby growing a poly-Si epitaxial layer on the source/drain regions and on the poly-Si layer of the test pattern area. The test pattern area was observed by using the thickness measurement system 86 during the epitaxial growth.

Under the specified growth conditions, a growth rate of the epitaxial poly-Si layer on the source/drain regions equals to the growth rate of poly-Si layer on the underlaying poly-Si layer in the test pattern area. The thickness of the poly-Si epitaxial layer can be obtained by measuring the growth thickness of the poly-Si layer in the test pattern area.

The supply of $Si_2H_6$ gas to the growth chamber 98 was stopped as soon as the poly-Si thickness reached to a specified value which was 50 nm in this specific example. Then, the reactive gas in the growth chamber was extracted to take out the wafer 87 from the growth chamber 88.

The epitaxial process was repeatedly conducted for 1,000 pieces of the wafers and sampling inspections were performed every 100 pieces by using TEM inspection method in the central areas of the wafers.

As a result of observation, the thickness of the wafers varied within less than ±1% and confirmed that the measurement according to the present invention was effective for the control of the thickness of a thin epitaxial layer.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing a semiconductor device comprising the steps of:
    (a) disposing a test pattern area on a silicon wafer outside a product area of said silicon wafer,
    (b) forming a first layer on said test pattern area having a layer of material with a different refractive index from that of Si;
    (c) forming a first poly Si layer on top of said first layer on said test pattern area;
    (d) forming an epitaxial layer in said product area and simultaneously forming a second poly Si layer on said first poly Si layer in said test pattern area,
    (e) measuring a thickness of one of (i) the first poly Si layer and (ii) the total thickness of said first poly Si layer and the second poly Si layer using visible light optical interference techniques; and
    (f) determining from the measuring step the thickness of said second poly Si layer; and
    (g) determining from said second poly Si layer the thickness of the simultaneously formed epitaxial layer.

2. The method as recited in claim 1 wherein said first layer comprises Si oxide.

3. The method as recited in claim 1 wherein said first layer comprises Si nitride.

4. The method as recited in claim 1 further comprising the step of stopping the formation of the epitaxial layer in said product area based on said thickness determined in step g).

5. The method as recited in claim 1 wherein step d) comprises the step of forming a Si epitaxial layer in said product area.

6. The method as recited in claim 1 wherein step d) comprises the step of:
    i) forming a Si-Ge epitaxial layer in said product area.

7. The method as recited in claim 1 wherein step d) comprises the step of:
    i) forming a Si-Ge epitaxial layer in said product area and simultaneously forming a second poly Si layer formed of Si-Ge.

8. The method as recited in claim 7 wherein said measuring step comprises the step of:
    measuring the total thickness of said first poly Si layer, said second poly Si layer formed of Si-Ge and said first layer having a material with a different refractive index from that of Si.

9. A method for manufacturing a semiconductor device comprising the steps of:
    a) disposing a test pattern area on a silicon wafer outside a product area of said silicon wafer,
    b) forming a buried layer on said test pattern area, said buried layer having a different refractive index from that of Si;
    c) forming an epitaxial Si layer in said product area and simultaneously forming an epitaxial poly Si layer on said test pattern area above said buried layer,
    d) measuring a thickness above said buried layer before and after step c),
    e) determining from the difference between said after and before measurements of step d) the thickness of said epitaxial poly Si layer.

10. The method as recited in claim 9 wherein said forming step c) includes:
    i) forming an epitaxial Si-Ge layer in said product area and simultaneously forming an epitaxial poly Si-Ge layer on said test pattern area above said buried layer and said measuring step d) includes measuring the thickness in said test pattern area of said epitaxial poly Si-Ge said Si layer above said buried layer and said buried layer.

* * * * *